(12) United States Patent
Lee et al.

(10) Patent No.: US 8,648,526 B2
(45) Date of Patent: Feb. 11, 2014

(54) ORGANIC LIGHT EMITTING DISPLAY APPARATUS

(75) Inventors: Sung-Hun Lee, Yongin (KR); Jung-Bae Song, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 175 days.

(21) Appl. No.: 12/929,841

(22) Filed: Feb. 18, 2011

(65) Prior Publication Data

US 2011/0204771 A1 Aug. 25, 2011

(30) Foreign Application Priority Data

Feb. 19, 2010 (KR) ........................ 10-2010-0015245

(51) Int. Cl.
*H01J 1/62* (2006.01)
*H01J 63/04* (2006.01)

(52) U.S. Cl.
USPC ............................ 313/504; 313/506; 313/512

(58) Field of Classification Search
USPC .......................................... 313/504, 506, 512
See application file for complete search history.

(56) References Cited

U.S. PATENT DOCUMENTS

| | | | | |
|---|---|---|---|---|
| 5,780,174 A * | 7/1998 | Tokito et al. | .................. | 428/690 |
| 6,861,800 B2 * | 3/2005 | Tyan et al. | ..................... | 313/506 |
| 7,030,553 B2 * | 4/2006 | Winters et al. | ................ | 313/504 |
| 7,129,634 B2 * | 10/2006 | Boroson et al. | ............... | 313/504 |
| 7,132,789 B2 * | 11/2006 | Kobayashi | .................... | 313/504 |
| 7,268,490 B2 * | 9/2007 | Oota | ............................. | 313/506 |
| 7,510,455 B2 * | 3/2009 | Suzuki | ............................ | 445/24 |
| 7,579,203 B2 * | 8/2009 | Yamazaki et al. | .............. | 438/35 |
| 7,839,084 B2 * | 11/2010 | Nishikawa et al. | ........... | 313/506 |
| 7,875,893 B2 * | 1/2011 | Seo et al. | ........................ | 257/88 |
| 8,022,612 B2 * | 9/2011 | Cok et al. | ....................... | 313/503 |
| 8,058,800 B2 * | 11/2011 | Hwang et al. | ................. | 313/506 |
| 8,288,784 B2 * | 10/2012 | Cho | ................................ | 257/89 |
| 2002/0024051 A1 * | 2/2002 | Yamazaki et al. | .............. | 257/79 |
| 2004/0149984 A1 * | 8/2004 | Tyan et al. | ...................... | 257/40 |
| 2004/0155576 A1 * | 8/2004 | Tyan et al. | ..................... | 313/504 |
| 2004/0239240 A1 | 12/2004 | Kato | | |
| 2005/0040756 A1 * | 2/2005 | Winters et al. | ................ | 313/504 |
| 2005/0067945 A1 * | 3/2005 | Nishikawa et al. | ........... | 313/501 |

(Continued)

FOREIGN PATENT DOCUMENTS

| | | |
|---|---|---|
| JP | 6-109909 A | 4/1994 |
| JP | 2000-231101 A | 8/2000 |

(Continued)

OTHER PUBLICATIONS

Korean Notice of Allowance in KR 10-2010-0015245, dated Oct. 31, 2011 (Lee, et al.).

*Primary Examiner* — Nimeshkumar Patel
*Assistant Examiner* — Thomas A Hollweg
(74) *Attorney, Agent, or Firm* — Lee & Morse, P.C.

(57) ABSTRACT

An organic light emitting display apparatus includes a substrate, a color filter layer on the substrate, a transflective reflective layer on the color filter layer, the transflective reflective layer being configured to partly transmit and partly reflect visible light, a first electrode on the transflective reflective layer, an intermediate layer on the first electrode, the intermediate layer including an organic emission layer, a second electrode on the intermediate layer, and an optical path control layer (OPCL) between the transflective reflective layer and the first electrode, the OPCL including an insulating material and being configured to control a path of light generated in the intermediate layer.

12 Claims, 2 Drawing Sheets

(56) References Cited

U.S. PATENT DOCUMENTS

| | | | |
|---|---|---|---|
| 2005/0225232 A1* | 10/2005 | Boroson et al. | 313/504 |
| 2006/0108919 A1* | 5/2006 | Kobayashi | 313/506 |
| 2008/0129191 A1 | 6/2008 | Lee et al. | |
| 2009/0096359 A1 | 4/2009 | Lee et al. | |
| 2009/0201229 A1* | 8/2009 | Kobayashi | 345/76 |
| 2009/0230858 A1* | 9/2009 | Kobayashi | 313/504 |
| 2010/0006872 A1* | 1/2010 | Seo et al. | 257/89 |

FOREIGN PATENT DOCUMENTS

| | | |
|---|---|---|
| KR | 10 2003-0013700 A | 2/2003 |
| KR | 10 2004-0045201 A | 6/2004 |
| KR | 10 2004-0072827 A | 8/2004 |
| KR | 10 2004-0079019 A | 9/2004 |
| KR | 10 2004-0089532 A | 10/2004 |
| KR | 10 2004-0099733 A | 12/2004 |
| KR | 10 2006-0081649 A | 7/2006 |
| KR | 10 2006-0124535 A | 12/2006 |
| KR | 10 2007-0003693 A | 1/2007 |
| KR | 10 2007-0015365 A | 2/2007 |
| KR | 10 2007-0069410 A | 7/2007 |
| KR | 10 2007-0077453 A | 7/2007 |
| KR | 10 2008-0046990 A | 5/2008 |
| KR | 10 2008-0047782 A | 5/2008 |
| KR | 10 2008-0050899 A | 6/2008 |
| KR | 10 2009-0038637 A | 4/2009 |
| KR | 10 2009-0047158 A | 5/2009 |

* cited by examiner

ORGANIC LIGHT EMITTING DISPLAY APPARATUS

BACKGROUND

1. Field

Embodiments relate to an organic light emitting display apparatus, and more particularly, to an organic light emitting display apparatus having a structure configured to easily improve luminescent efficiency and prevent defects.

2. Description of the Related Art

Display devices may include portable, thin flat panel display devices, e.g., electroluminescent display devices. The electroluminescent display devices, e.g., organic light emitting display apparatuses, are self-emissive display devices having a wide viewing angle, an excellent contrast ratio, and a high response speed, and thus, are regarded as next-generation display devices. For example, an organic light emitting display apparatus may include an emission layer formed of an organic material that has excellent luminosity and realizes multiple colors, and may exhibit enhanced driving voltage and response speed characteristics, as compared to inorganic light emitting display apparatuses.

The conventional organic light emitting display apparatus may have a structure in which an organic emission layer is between a cathode electrode and an anode electrode. When a voltage is applied to the cathode and anode electrodes, visible light is generated in the organic emission layer connected to the cathode and anode electrodes.

SUMMARY

Embodiments are therefore directed to an organic light emitting display apparatus, which substantially overcomes one or more of the problems due to the limitations and disadvantages of the related art.

It is therefore a feature of an embodiment to provide an organic light emitting display apparatus having a structure capable of easily improving luminescent efficiency.

It is therefore another feature of an embodiment to provide an organic light emitting display apparatus having a structure capable of preventing defect occurrence.

At least one of the above and other features and advantages may be realized by providing an organic light emitting display apparatus, including a substrate, a color filter layer arranged on the substrate, a transflective reflective layer formed on the color filter layer, and for partly transmitting and partly reflecting visible light, a first electrode formed above the transflective reflective layer, an intermediate layer formed on the first electrode and including an organic emission layer, a second electrode formed on the intermediate layer, and an optical path control layer (OPCL) formed between the transflective reflective layer and the first electrode, for controlling a path of light generated in the intermediate layer, and including an insulating material.

The color filter layer may be formed to contact the substrate.

The transflective reflective layer may include a metal.

The transflective reflective layer may be formed to have a plurality of layers formed by stacking a first insulating material having a particular refractive index and a second insulating material having a refractive index greater than the particular refractive index of the first insulating material.

The transflective reflective layer may be a non-patterned layer.

The transflective reflective layer may be a continuous layer overlapping all sections of the color filter layer and portions therebetween. The transflective reflective layer may be a metal layer. The transflective reflective layer may have a multi-layered structure including a plurality of stacked insulating layers having different refractive indices.

The OPCL may include at least one selected from the group consisting of an organic material, an oxide, a nitride, and a sulfide.

The OPCL may include at least one selected from the group consisting of $Al_2O_3$, $BaO$, $MgO$, $HfO_2$, $ZrO_2$, $CaO_2$, $SrO_2$, $Y_2O_3$, $Si_3N_4$, $AlN$, $ZnS$ and $CdS$.

The organic light emitting display apparatus may further include a black matrix formed between the substrate and the transflective reflective layer.

The black matrix may be arranged at the same layer as the color filter layer.

The OPCL may be formed to be flat in a region corresponding to the first electrode.

The organic light emitting display apparatus may further include a thin film transistor (TFT) formed between the transflective reflective layer and the OPCL, and electrically connected to the first electrode.

The OPCL may be formed to cover the TFT.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
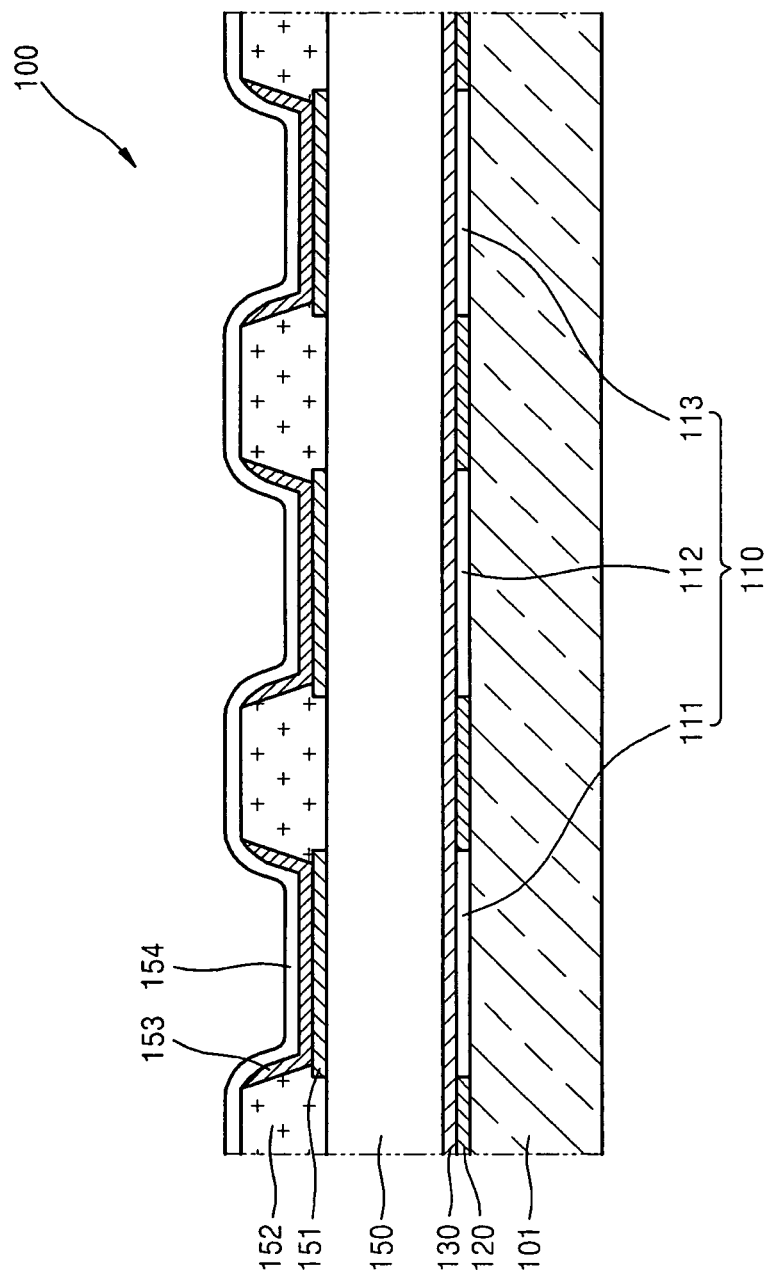
FIG. 1 illustrates a cross-sectional view of an organic light emitting display apparatus according to an embodiment.

Korean Patent Application No. 10-2010-0015245, filed on Feb. 19, 2010, in the Korean Intellectual Property Office, and entitled: "Organic Light Emitting Display Apparatus," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of an organic light emitting display apparatus 100 according to an embodiment. Referring to FIG. 1, the organic light emitting display apparatus 100 may include a substrate 101, a color filter layer 110, a transflective reflective layer 130, an optical path control layer (OPCL) 150, a first electrode 151, an intermediate layer 153, and a second electrode 154.

In more detail, the substrate 101 may be formed of a transparent material. For example, the substrate 101 may be formed of glass containing $SiO_2$ as a main component, but is not limited thereto. That is, in another example, the substrate 101 may be formed of a transparent plastic material that is an insulating organic material, e.g., one or more of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), triacetate cellulose (TAC), and cellulose acetate propionate (CAP).

The color filter layer 110 may be formed on the substrate 101. The color filter layer 110 may include a plurality of color filter sections, e.g., a first color filter layer 111, a second color filter layer 112, and a third color filter layer 113. The plurality of color filter sections, e.g., the first color filter layer 111, the second color filter layer 112, and the third color filter layer 113, may realize different colors. For example, the first color filter layer 111 may be a red color filter layer, the second color filter layer 112 may be a green color filter layer, and the third color filter layer 113 may be a blue color filter layer. The color filter layer 110 may be a region through which visible light generated in the intermediate layer 153 is passed, and may be formed to correspond to the intermediate layer 153. For example, the plurality of color filter sections may be discrete sections, so each section overlaps a different intermediate layer 153, e.g., the first and second color filter layers 111 and 112 may overlap two adjacent intermediate layers 153. Also, the color filter layer 110 may provide a flat surface on the substrate 101, and may function as a buffer layer for preventing water and dust from penetrating to the substrate 101.

A black matrix 120 may be arranged above, e.g., on, the substrate 101. The black matrix 120 may be formed to have a particular pattern, and may improve a contrast of the organic light emitting display apparatus 100 by absorbing visible light entering from outside the organic light emitting display apparatus 100 and by preventing color mixture and color interference between the first color filter layer 111, the second color filter layer 112, and the third color filter layer 113. The black matrix 120 may be arranged in a same layer as the color filter layer 110, e.g., sections of the black matrix 120 and sections of the color filter layer 110 may be arranged alternately on, e.g., directly on, the substrate 101. That is, the black matrix 120 may be arranged around the first color filter layer 111, around the second color filter layer 112, and around the third color filter layer 113. However, arrangement of the black matrix 120 according to the present embodiment is not limited thereto, e.g., the black matrix 120 may be formed above or below the color filter layer 110.

The transflective reflective layer 130 may be formed on the color filter layer 110. The transflective reflective layer 130 partly transmits and partly reflects light generated in the intermediate layer 153. For example, the transflective reflective layer 130 may be formed of a metallic thin film, e.g., the transflective reflective layer 130 may include silver (Ag). However, embodiments are not limited thereto, e.g., the transflective reflective layer 130 may include various metals having high reflectivity.

In another example, the transflective reflective layer 130 may be formed by stacking insulating materials, e.g., layers, having different refractive indexes. That is, the transflective reflective layer 130 may have a structure including a plurality of layers in which a first insulating material and a second insulating material are alternately stacked, i.e., the transflective reflective layer 130 may have a stacked structure including at least two layers. When the transflective reflective layer 130 includes at least two layers, the first insulating material and the second insulating material may have different refractive indexes, e.g., the first insulating material may have a relatively low refractive index and the second insulating material may have a relatively high refractive index. For example, the first insulating material may be $SiO_x$, and the second insulating material may be $SiN_x$.

As discussed previously, the transflective reflective layer 130 partly reflects light generated in the intermediate layer 153. By doing so, the light generated in the intermediate layer 153 may realize a microcavity effect by resonating between the intermediate layer 153 and the transflective reflective layer 130, thereby enhancing luminance of the emitted light.

The transflective reflective layer 130 may cover, i.e., overlap, an entire surface of the substrate 101. For example, the transflective reflective layer 130 may continuously cover entire upper surfaces of the color filter layer 110 and the black matrix 120. Thus, the transflective reflective layer 130 may not require patterning. As the transflective reflective layer 130 is not patterned, it may be possible to prevent defects in the organic light emitting display apparatus 100, e.g., defects due to formation of metal particles generated during a patterning operation and/or due to different etch selectivities of the plurality of stacked layers within the transflective reflective layer 130 during the patterning operation.

The OPCL 150 may be formed on, e.g., directly on, the transflective reflective layer 130, e.g., the OPCL 150 may be formed between the transflective reflective layer 130 and the intermediate layer 153. The OPCL 150 may be formed of a material having a relatively high transmittance so as to allow light generated in the intermediate layer 153 to be easily transmitted through the OPCL 150. In more detail, the OPCL 150 may have a transmittance greater than or equal to about 90%. The OPCL 150 may adjust a space in which the visible light that is generated in the intermediate layer 153 optically resonates, i.e., the OPCL 150 may define a predetermined distance between the transflective reflective layer 130 and the intermediate layer 153 for the microcavity effect, so that the OPCL 150 may emit light having a desired characteristic toward a side surface corresponding to a user, i.e., toward a screen of the organic light emitting display apparatus 100 that faces the user.

The OPCL 150 may include at least one of an organic material, an oxide, a nitride, and a sulfide. In more detail, the OPCL 150 may include at least one of $Al_2O_3$, BaO, MgO, $HfO_2$, $ZrO_2$, $CaO_2$, $SrO_2$, $Y_2O_3$, $Si_3N_4$, AlN, ZnS, and CdS. The OPCL 150 may be formed to be flat. That is, the OPCL 150 may be formed to be flat in a region corresponding to, i.e., overlapping, the first electrode 151. For example, a portion of the OPCL 150 overlapping the entire first electrode 151 may have a substantially uniform thickness along a direction normal to the substrate 101.

The first electrode 151 may be formed on, e.g., directly on, the OPCL 150. For example, the first electrode 151 may be formed of ITO, IZO, ZnO, or $In_2O_3$ so as to transmit light generated in the intermediate layer 153. In another example, the first electrode 151 may be formed of a metallic thin film including Ag, Mg, Al, Pt, Pd, Au, Ni, Nd, Ir, or Cr.

A pixel defining layer 152 may be formed on the first electrode 151. The pixel defining layer 152 may include various insulating materials, and may be formed to expose a particular portion of the first electrode 151 to allow for the intermediate layer 153 to be formed on an exposed top surface of the first electrode 151. The second electrode 154 may be formed on the intermediate layer 153.

The intermediate layer 153 may include an organic emission layer. When voltage is applied to the first electrode 151 and the second electrode 154, visible light is generated in the organic emission layer. It is noted that the organic emission layer in the intermediate layer 153 is not illustrated separately in FIG. 1, as reference numeral 153 may also represent the emission layer. The intermediate layer 153 may be arranged for each sub-pixel, so three intermediate layers 153 of three sub-pixels are illustrated in FIG. 1. The three intermediate layers 153 may include organic emission layers for emitting visible light having the same color, e.g., the three intermediate layers 153 may include organic emission layers for emitting visible light having a white color. However, the organic emission layers of the intermediate layers 153 are not limited thereto. For example, each of the intermediate layers 153 may include organic emission layers for emitting visible light having different colors, e.g., the intermediate layers 153 may each respectively include a red-color organic emission layer, a blue-color organic emission layer, and a green-color organic emission layer. Also, the intermediate layers 153 may each respectively include a red-color organic emission layer, a blue-color organic emission layer, a green-color organic emission layer, and a white-color organic emission layer for each of the sub-pixels.

The second electrode 154 may be formed to cover all pixels. The second electrode 154 may be formed of various conductive materials, e.g., one or more of Li, Ca, LiF/Ca, LiF/Al, Al, Mg, ITO, IZO, ZnO, or $In_2O_3$.

A sealing member (not shown) may be formed on the second electrode 154.

The sealing member may be formed to protect the intermediate layers 153 and other layers from water or oxygen penetrating to the intermediate layers 153 from outside, and may be formed of a transparent material. For example, the sealing member may have a structure in which a glass, a plastic, or a plurality of stacked organic and inorganic materials.

In the organic light emitting display apparatus 100 according to the present embodiment, light that is generated in the intermediate layers 153 and is emitted toward the substrate 101 is partly reflected by the transflective reflective layer 130. The light reflected by the transflective reflective layer 130 is directed back to the intermediate layer 153, and then is reflected again by the first electrode 151 or the intermediate layers 153 toward the substrate 101. In other words, the light generated in the intermediate layers 153 resonates in the space between the intermediate layer 153 and the transflective reflective layer 130, so light emitted toward the screen of the organic light emitting display apparatus 100 is amplified and exhibits increased luminous efficiency. Also, since the OPCL 150 is arranged in the space in which the optical resonance occurs, light having a desired characteristic may be easily emitted.

The organic light emitting display apparatus 100 according to the present embodiment may include the intermediate layer 153 having an organic emission layer for realizing white-color visible light, and the color filter layer 110 for converting the white-color visible light into a desired color. Here, the color filter layer 110 may be formed on the substrate 101, thereby protecting the substrate 101 and providing a flat surface on top of the substrate 101.

The transflective reflective layer 130 may be formed above the color filter layer 110, and the OPCL 150 may be formed above, e.g., on, the transflective reflective layer 130. Since the transflective reflective layer 130 is a continuous layer overlapping the entire color filter 110 and the black matrix 120 therebetween, the transflective reflective layer 130 may not require a patterning operation, thereby preventing potential defects occurring during patterning, e.g., defects occurring due to formation of metal particles generated during a patterning operation or defects caused due to the different etch selectivities of stacked layers within the transflective reflective layer 130.

Figure 2:
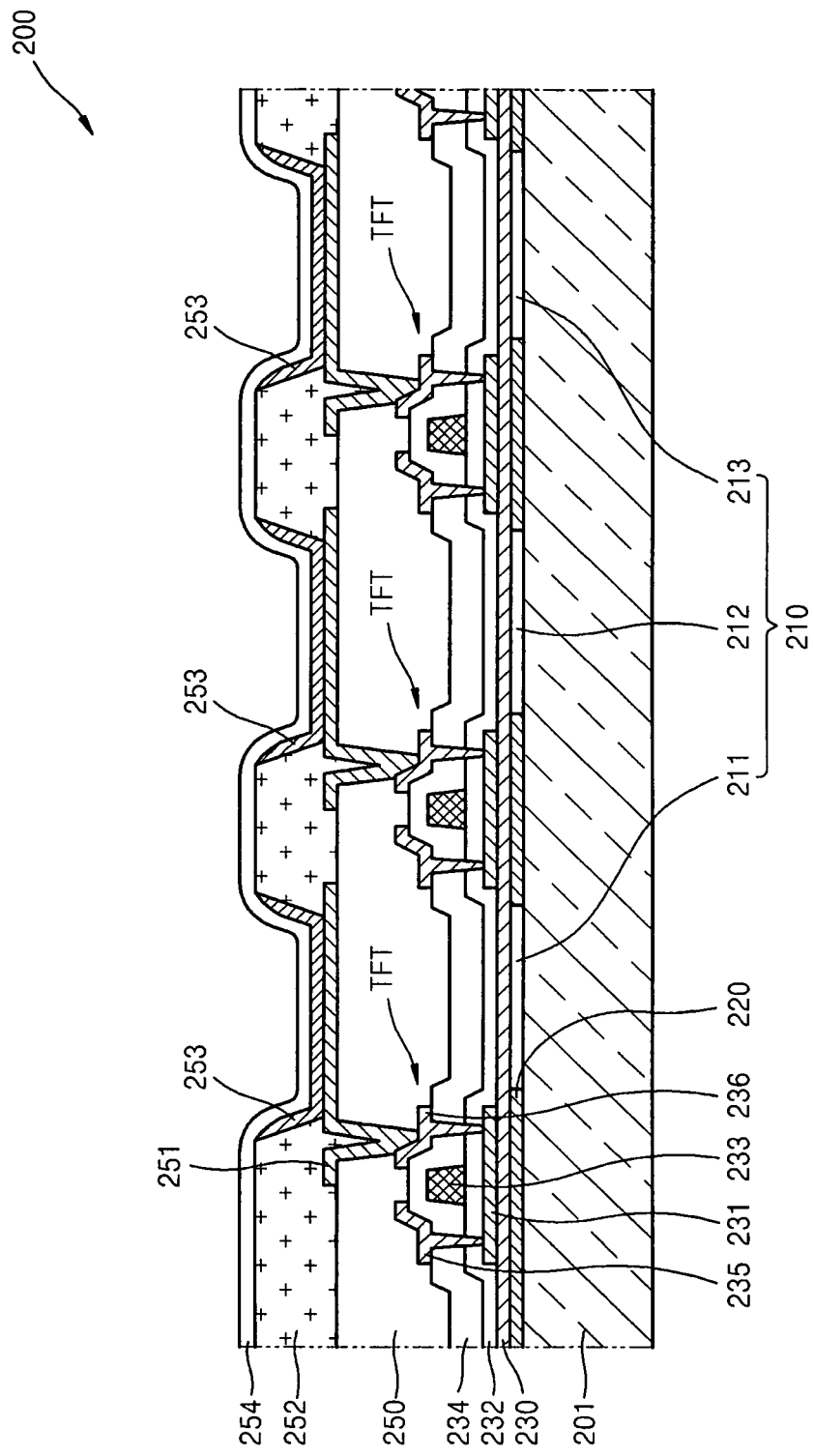
FIG. 2 illustrates a cross-sectional view of an organic light emitting display apparatus according to another embodiment.

FIG. 2 illustrates a cross-sectional view of an organic light emitting display apparatus 200 according to another embodiment. For convenience of description, the present embodiment will be described with respect to differences relative to the previous embodiment.

Referring to FIG. 2, the organic light emitting display apparatus 200 may include a substrate 201, a color filter layer 210, a transflective reflective layer 230, a thin film transistor (TFT), an OPCL 250, a first electrode 251, an intermediate layer 253, and a second electrode 254. The TFT may include an active layer 231, a gate insulating layer 232, a gate electrode 233, a source electrode 235, and a drain electrode 236.

In more detail, the color filter layer 210 may be formed on the substrate 201. The color filter layer 210 may include a first color filter layer 211, a second color filter layer 212, and a third color filter layer 213.

A black matrix 220 may be arranged above the substrate 201. The black matrix 220 may be formed to have a particular pattern, and may improve a contrast of the organic light emitting display apparatus 200 by absorbing visible light entering from outside the organic light emitting display apparatus 200 and by preventing color mixture and color interference between the first color filter layer 211, the second color filter layer 212, and the third color filter layer 213.

The black matrix 220 may be arranged at the same layer as the color filter layer 210. That is, the black matrix 220 may be arranged around the first color filter layer 211, around the second color filter layer 212, and around the third color filter layer 213. However, arrangement of the black matrix 220 according to the present embodiment is not limited thereto, e.g., the black matrix 220 may be formed above or below the color filter layer 210.

The transflective reflective layer 230 may be formed on the color filter layer 210. The transflective reflective layer 230 partly transmits and partly reflects light generated in the intermediate layer 253. Therefore, the transflective reflective layer 230 may be formed of a metallic thin film. Also, the transflective reflective layer 230 may be formed by stacking insulating materials having different refractive indexes.

The transflective reflective layer 230 may not be patterned, e.g., may be formed to cover an entire surface of the color filter layer 210. Thus, it may not be necessary to perform a patterning operation on the transflective reflective layer 230, which includes a metal or a plurality of stacked layers.

The active layer 231 having a particular pattern may be formed on the transflective reflective layer 230. The active layer 231 may be formed of an inorganic semiconductor including amorphous silicon or poly silicon or may be formed of an organic semiconductor, and includes a source region, a drain region, and a channel region. The gate insulating layer 232 may be formed on the active layer 231, and the gate electrode 233 may be formed on a particular region in an upper portion of the gate insulating layer 232. The gate electrode 233 may be connected to a gate line (not shown) that applies TFT on/off signals to the TFT. The gate electrode 233 may be formed of a metal, e.g., one or more of Au, Ag, Cu, Ni, Pt, Pd, Al, or Mo, or a metal alloy including an Al:Nd alloy, a Mo:W alloy, or the like, but is not limited thereto.

An interlayer insulating layer 234 may be formed above the gate electrode 233 so as to expose the source and drain regions of the active layer 231. Then, the source electrode 235 and the drain electrode 236 may be formed to respectively contact the exposed source and drain regions of the active layer 231.

The OPCL 250 may be formed on the TFT. The OPCL 250 may be formed of a material having (a relatively) high transmittance so as to allow light generated in the intermediate layer 253 to easily pass through the OPCL 250. The OPCL 250 may adjust a space in which the visible light that is generated in the intermediate layer 253 optically resonates, i.e., the OPCL 250 may adjust a distance between the intermediate layer 253 and the transflective reflective layer 230, so that the OPCL 250 emits light having a desired characteristic toward a side surface corresponding to a user.

The OPCL 250 may be formed to cover the TFT, thereby protecting the TFT. Also, the OPCL 250 may be formed to be flat, e.g., the OPCL 250 may be formed to be flat in a region corresponding to the first electrode 251. Detailed materials for forming the transflective reflective layer 230 and the OPCL 250 are the same as in the previous embodiment described with reference to FIG. 1, and thus, detailed descriptions thereof will not be repeated.

The first electrode 251 may be formed on the OPCL 250. The OPCL 250 may be formed to expose the drain electrode 236, and the first electrode 251 may be connected to the exposed drain electrode 236.

A pixel defining layer 252 may be formed on the first electrode 251. The pixel defining layer 252 may include various insulating materials, and may be formed to expose a particular portion of the first electrode 251. The intermediate layer 253 may be formed on an exposed top surface of the first electrode 251, and the second electrode 254 may be formed on the intermediate layer 253.

The intermediate layer 253 may include an organic emission layer (not shown). When a voltage is applied to the first electrode 251 and the second electrode 254, visible light is emitted in the organic emission layer.

The second electrode 254 may be formed to cover all pixels. A sealing member (not shown) may be formed on the second electrode 254. The sealing member may be formed to protect the intermediate layers 253 and other layers from water and oxygen outside, and may be formed of a transparent material, e.g., glass, plastic, or a plurality of stacked organic and inorganic materials.

In the organic light emitting display apparatus 200 according to the present embodiment, the light amplified due to resonance is emitted toward the side surface corresponding to the user and thus the luminescent efficiency is increased. Also, since the OPCL 250 is arranged in the space in which the optical resonance occurs, light having a desired characteristic may be easily emitted.

The color filter layer 210 in the organic light emitting display apparatus 200 according to the present embodiment may be formed on the substrate 201, thereby protecting the substrate 201 and providing a flat surface on the top surface of the substrate 201.

The transflective reflective layer 230 may be formed above the color filter layer 210, and the OPCL 250 may be formed on the transflective reflective layer 230. Since it is not necessary to perform the patterning operation on the transflective reflective layer 230, it may be possible to prevent defects occurring due to formation of metal particles generated during a patterning operation. Also, it may be possible to prevent patterning defects when forming the transflective reflective layer 230 as a stacked structure due to the different etch selectivities.

In addition, the organic light emitting display apparatus 200 according to the present embodiment may include the TFT, and the OPCL 250 arranged on the TFT, so that it may not be necessary to further include a passivation layer for protecting the TFT. Also, since the region of the OPCL 250 corresponding to the first electrode 251 is formed to be flat, it may not be necessary to separately arrange a planarization layer. By doing so, a thickness of the organic light emitting display apparatus 200 may be reduced, and convenience in a manufacturing procedure may be increased.

As described above, an organic light emitting display apparatus according to one or more of the above embodiments may easily improve the luminescent efficiency and may easily prevent defect occurrence. In contrast, increase of a luminescent efficiency in a conventional organic light emitting display apparatus may be limited, as the visible light may vanish when passing through the cathode electrode, the anode electrode, and/or other elements, e.g., a polarizing layer. Also, increase of performance of the conventional organic light emitting display apparatus may be limited, as patterning processes of thin films may cause defects, e.g., thin films may be damaged.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display apparatus, comprising:
a substrate;
a color filter layer on the substrate;
a transflective reflective layer on the color filter layer, the transflective reflective layer being configured to partly transmit and partly reflect visible light, and the transflective reflective layer being a continuous layer overlapping all sections of the color filter layer and portions therebetween;
a first electrode on the transflective reflective layer;
an intermediate layer on the first electrode, the intermediate layer including an organic emission layer;
a second electrode on the intermediate layer;
an optical path control layer (OPCL) between the transflective reflective layer and the first electrode, the OPCL including an insulating material and being configured to control a path of light generated in the intermediate layer; and
a thin film transistor (TFT) between the transflective reflective layer and the OPCL, the TFT being electrically connected to the first electrode,
wherein the OPCL covers the TFT, the OPCL being flat in a region corresponding to the first electrode.

2. The organic light emitting display apparatus as claimed in claim 1, wherein the color filter layer contacts the substrate.

3. The organic light emitting display apparatus as claimed in claim 1, wherein the transflective reflective layer includes a metal.

4. The organic light emitting display apparatus as claimed in claim 1, wherein the transflective reflective layer includes a plurality of stacked insulating materials, the stacked insulating materials including at least a first insulating material having a first refractive index and a second insulating material having a second refractive index greater than the first refractive index of the first insulating material.

5. The organic light emitting display apparatus as claimed in claim 1, wherein the transflective reflective layer is a non-patterned layer.

6. The organic light emitting display apparatus as claimed in claim 1, wherein the transflective reflective layer is a metal layer.

7. The organic light emitting display apparatus as claimed in claim 1, wherein the transflective reflective layer has a multi-layered structure including a plurality of stacked insulating layers having different refractive indices.

8. The organic light emitting display apparatus as claimed in claim 1, wherein the OPCL includes at least one of an organic material, an oxide, a nitride, and a sulfide.

9. The organic light emitting display apparatus as claimed in claim 1, wherein the OPCL includes at least one of $Al_2O_3$, $BaO$, $MgO$, $HfO_2$, $ZrO_2$, $CaO_2$, $SrO_2$, $Y_2O_3$, $Si_3N_4$, $AlN$, $ZnS$, and $CdS$.

10. The organic light emitting display apparatus as claimed in claim 1, wherein the OPCL is flat in a region corresponding to the first electrode.

11. The organic light emitting display apparatus as claimed in claim 1, further comprising a black matrix between the substrate and the transflective reflective layer.

12. The organic light emitting display apparatus as claimed in claim 11, wherein the black matrix is arranged in a same layer as the color filter layer.

* * * * *